United States Patent [19]

McEachern et al.

[11] Patent Number: 5,347,464
[45] Date of Patent: Sep. 13, 1994

[54] HIGH-PASS FILTER FOR ENHANCING THE RESOLUTION OF AC POWER LINE HARMONIC MEASUREMENTS

[75] Inventors: Alexander McEachern, Oakland; Bryan D. Hord, San Francisco, both of Calif.

[73] Assignee: Basic Measuring Instruments, Foster City, Calif.

[21] Appl. No.: 949,026

[22] Filed: Sep. 22, 1992

[51] Int. Cl.$^5$ .................. G01R 31/11; G06F 15/56
[52] U.S. Cl. .................... 364/483; 324/520; 364/481; 364/492; 341/131
[58] Field of Search ............... 364/481, 483, 487, 492, 364/550; 324/520, 527, 532, 533, 534, 127, 142; 340/661, 870.17; 341/131, 139

[56] References Cited

U.S. PATENT DOCUMENTS

| | | | |
|---|---|---|---|
| 4,466,071 | 8/1984 | Russell, Jr. | 324/520 X |
| 4,694,055 | 10/1988 | Grassel et al. | 364/485 |
| 4,758,962 | 7/1988 | Fernandes | 364/483 |
| 4,777,605 | 10/1988 | Pilkington | 364/484 |
| 4,783,748 | 11/1988 | Swarztrabuer | 364/483 |
| 4,799,005 | 1/1989 | Fernandes | 324/127 |
| 4,818,947 | 4/1989 | Zucker et al. | 324/520 X |
| 4,980,634 | 12/1990 | Mallinson | 364/483 |
| 5,180,971 | 1/1993 | Montijo | 364/487 X |
| 5,212,441 | 5/1993 | McEachern et al. | 364/483 X |
| 5,272,439 | 12/1993 | Mashikian et al. | 324/520 |

*Primary Examiner*—Kevin J. Teska
*Attorney, Agent, or Firm*—Haverstock, Medlen & Carroll

[57] ABSTRACT

An instrument employs a high-pass filter and an associated amplifier to reduce the number of Analog-to-Digital-Converter bits required to determine the amplitude of harmonics contained in digitally sampled AC (alternating current) power system voltage or current waveforms. The instrument is coupled to a power system having a line conductor and a neutral conductor for obtaining time-domain representations of the current flowing in the line conductor and the voltage difference between the line conductor and the neutral conductor. The time-domain representations are converted to frequency-domain representations by a single-chip microprocessor.

24 Claims, 2 Drawing Sheets

HIGH-PASS FILTER FOR ENHANCING THE RESOLUTION OF AC POWER LINE HARMONIC MEASUREMENTS

FIELD OF THE INVENTION

This invention relates to a method and apparatus for calculating harmonic levels in voltage and current waveforms measured on AC (alternating current) power systems. More specifically, this invention relates to instruments which accurately measure small harmonic signals in the presence of a larger fundamental signal.

BACKGROUND OF THE INVENTION

Electric power is ordinarily delivered to residences, commercial facilities, and industrial facilities as an AC (alternating current) voltage that approximates a sine wave with respect to time, and ordinarily flows through a residence or facility as an AC current that also approximates a sine wave with respect to time.

The electric power distribution system operates most efficiently and most safely when both the voltage and current are sine waves. However, certain kinds of loads draw current in a non-sinusoidal waveform. If these loads are large relative to the distribution system source impedance, the system voltage will become non-sinusoidal as well.

These non-sinusoidal voltage and current waveforms may be conveniently expressed as a Fourier series (a sum of sinusoidal waveforms of differing frequencies, magnitudes, and phase angles). Under most circumstances, the Fourier series for AC power system voltage and current waveforms consists of a fundamental frequency, typically 50 Hertz or 60 Hertz, plus integer multiples of the fundamental frequency. These integer multiples of the fundamental frequency are referred to as "harmonics".

In AC power system measurements, it is a well-known technique to sample, at regular intervals much shorter than one period of the fundamental waveform, a voltage or current waveform for a length of time called a "sampling window", then convert those samples to digital values yielding a digital discrete time-domain representation of the waveform. It is also a well-known technique to employ a Discrete Fourier Transform (DFT) or Fast Fourier Transform (FFT) which is a special case of the DFT, to convert that time-domain representation of the waveform to a frequency-domain representation. This frequency-domain representation can be used to measure the magnitude and phase angle of the harmonics present in an AC power system voltage or current waveform.

It is known to those familiar with the art that if the AC power system voltage or current waveform presented to the Analog-to-Digital Converter has any content at a frequency higher than one half of the sampling frequency, errors in measurement may result. Thus it is common practice to include a low-pass filter prior to the Analog-to-Digital-Converter with a corner frequency well below one half of the sampling frequency. It is also known to those familiar with the art that harmonic voltages and currents can have important effects even when their level is small. For example, voltage harmonics that are less than 1% of the amplitude of the voltage fundamental may require filtering. Consequently, many commercially available harmonic measuring instruments have the ability to measure individual harmonics to a resolution of 0.1% of the fundamental or better. Two such commercially available instruments are the Model 3030A from Basic Measuring Instruments of Foster City, Calif., and the model 8000 from Dranetz Technologies of Edison, N.J. Extracting such small harmonic signals in the presence of a much larger fundamental signal is a challenge.

One prior art method used to meet this challenge employs a notch filter to eliminate the fundamental signal, leaving only the harmonic signals. This notch filter may be constructed from passive components, such as inductors and capacitors, or it may be constructed from active components such as operational amplifiers or switched-capacitor filters. This prior art method works well if the fundamental frequency is known in advance; however, if the fundamental frequency drifts, as it does on the output of a diesel generator, or if the instrument must be used both at 50 Hertz and 60 Hertz, the notch filter must be re-tuned.

A second prior art method used to meet this challenge employs an analog-to-digital converter with sufficient resolution to observe both the large fundamental signals and the small harmonic signals. For example, both of the commercially available instruments referred to previously employ analog-to-digital converters with 14-bit (13-bit-plus-sign) resolution. Given a signal where the fundamental is of half-scale amplitude, the analog-to-digital converter's resolution corresponds to one part in $2^{12}$ of the fundamental, or approximately 0.02% of the fundamental, which is more than sufficient for accurately measuring to a resolution of 0.1% of the fundamental. However, this method requires high resolution analog-to-digital converters which are generally more expensive than low resolution analog-to-digital converters.

It is an object of the present invention to accurately measure small harmonic signals in the presence of a larger fundamental signal while employing a relatively low resolution analog-to-digital converter and without employing precisely tuned filters.

SUMMARY OF THE INVENTION

An instrument employs a high-pass filter and an associated amplifier to reduce the number of Analog-to-Digital-Converter bits required to determine the amplitude of harmonics contained in digitally sampled AC (alternating current) power system voltage or current waveforms. The instrument is coupled to a power system having a line conductor and a neutral conductor for obtaining time-domain representations of the current flowing in the line conductor and the voltage difference between the line conductor and the neutral conductor. The time-domain representations are converted to frequency-domain representations by a single-chip microprocessor.

DETAILED DESCRIPTION OF A PREFERRED EMBODIMENT

Figure 1:
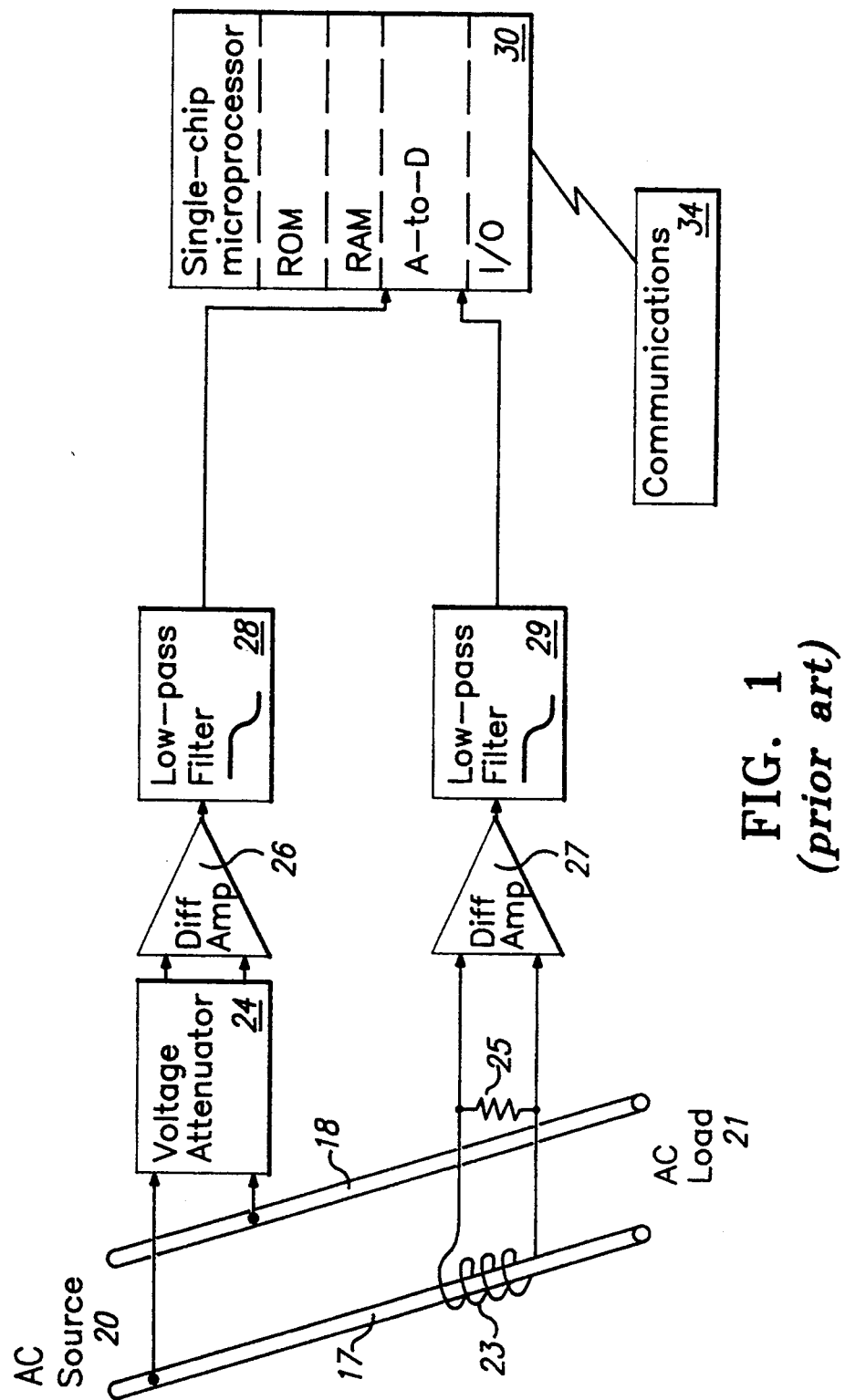
FIG. 1 shows a block diagram of a prior art instrument.

FIG. 1 illustrates a block diagram of prior art for measuring voltage and current harmonics on an AC power system. Power flows from an AC Source 20 to an AC Load 21 on a line conductor 17 and a neutral conductor 18. A voltage attenuator 24 reduces the voltage that appears between the line conductor 17 and the neutral conductor 18 to a level appropriate for further processing. The output of the voltage attenuator 24 is presented to a differential amplifier 26 which removes any undesired common-mode signals. A low-pass filter 28, commonly referred to as an "anti-aliasing" filter, ensures that the signal does not contain frequency components above one half of the sampling frequency. A current transformer 23 and its associated burden resistor 25 form a voltage proportional to the current flowing through the line conductor 17, and a differential amplifier 27 and a low-pass filter 29 perform functions for the current signal identical to those performed for the voltage signal by the differential amplifier 26 and the low-pass filter 28. A single-chip microprocessor 30 includes a Read-Only Memory (ROM), a Random-Access Memory (RAM), a multiplexed Analog-to-Digital Converter (A-to-D), and Input/Output circuits (I/O). The voltage signal and current signal output from the low-pass filters 28,29 are sampled at a sampling frequency by the A-to-D converter portion of the single-chip microprocessor 30. For typical power system applications, the sampling frequency is two orders of magnitude higher than the fundamental frequency of the power system. These samples are converted to digital values which form digital time-domain representations of the voltage and current signals. The single-chip microprocessor 30 then uses any well-known algorithm, such as the Fast Fourier Transform algorithm, to convert the time-domain representations to frequency-domain representations. The frequency-domain representations are communicated to another system for further processing through a communications port 34.

Figure 2:
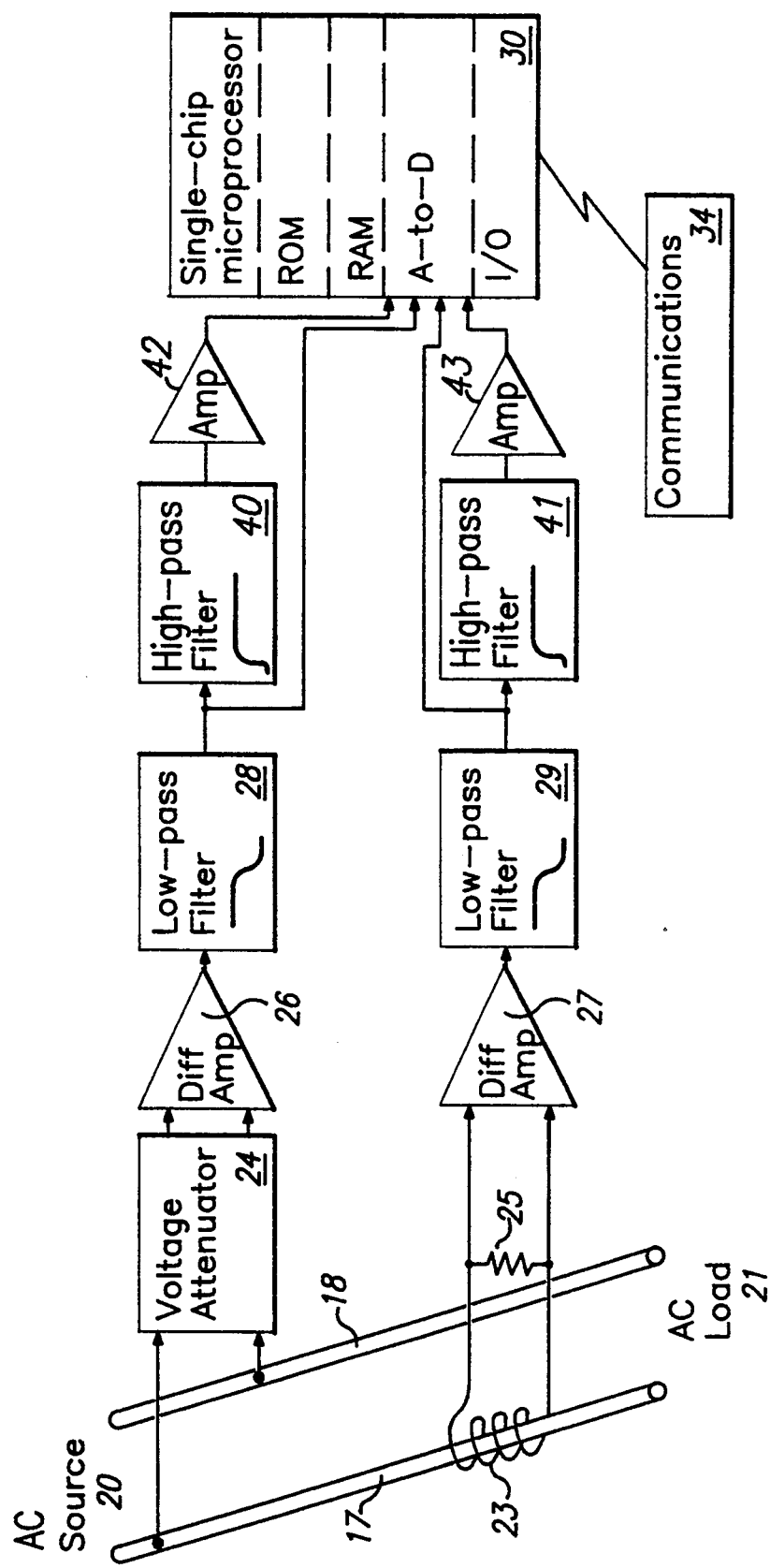
FIG. 2 shows a block diagram of the present invention, drawn in such a way to contrast with the prior art of FIG. 1.

FIG. 2 illustrates a block diagram of the present invention in which the high-pass filters 40,41 and the associated amplifiers 42,43 provide additional signals which the A-to-D converter can sample. These high-pass filters 40,41 have a corner frequency that is above the fundamental frequency of the power system and that is below the lowest harmonic frequency of interest, typically the third harmonic. The high-pass filters 40,41 remove the fundamental from the voltage and current signals which allows the amplifiers 42,43 to then increase the amplitude the remaining harmonic signals without saturating the A-to-D converter.

By setting the corner frequency of the high-pass filter 40 to cut off frequencies below 100 Hertz and setting the gain of its associated amplifier 42 to sixteen (16), a signal is presented to the single-chip microprocessor 30 that incorporates all of the voltage harmonics on both 50 Hertz and 60 Hertz power systems in a way that will allow an 8-bit analog-to-digital converter to measure the voltage harmonics with a resolution equivalent to that provided by a 12-bit analog-to-digital converter not equipped with a high-pass filter and an amplifier. The only constraint is that the harmonic voltage signals must be small enough that they do not saturate the analog-to-digital converter when they are amplified.

The function performed by the high-pass filter 41 and the associated amplifier 43 for the current signal is identical to that performed by the high-pass filter 40 and the associated amplifier 42 for the voltage signal. The amplifier 43 will typically be set to a lower gain than the amplifier 42, because current harmonics are typically larger than voltage harmonics. The high-pass filters 40,41 in combination with the low-pass filters 28,29 form band-pass filters in contrast to the prior art.

In an alternate embodiment of the invention, the gain factor of the amplifiers 42,43 is set by the single-chip microprocessor 30, allowing it to maximize the resolution of harmonic measurements while avoiding saturation of its analog-to-digital converter.

In the preferred embodiment, the voltage attenuator 24 is a resistive attenuator with a ratio of 120:1; the current transformer 23 and its associated burden resistor 25 provide an output of 1 volt per 100 amps; the differential amplifier blocks 26,27 provide a gain of 3; the low-pass filter blocks 28,29 implement a 4-pole Butterworth low-pass filter with a corner frequency of 2 kilohertz; the high-pass filter blocks 40,41 implement a 4-pole Butterworth high-pass filter with a corner frequency of 100 Hertz; the amplifier block 42 has a gain of 16; the amplifier block 41 has a gain of 5; and the single-chip microprocessor 30 is a model number 68HC05M4 available from Motorola Semiconductor of Austin, Tex. These component values and design values are given to illustrate one possible embodiment of the invention which is defined fully by the appended claims.

Various modifications may be made to the preferred embodiment without departing from the spirit and scope of the invention as defined by the appended claims.

We claim:

1. An apparatus for measuring alternating current power line voltage waveform harmonics from an alternating current power system having at least two line conductors and a fundamental frequency, the apparatus comprising:
   a. means for receiving a signal proportional to an alternating current power line voltage waveform, said means coupled to the line conductors;
   b. means for filtering the signal forming a filtered signal, said means coupled to the means for receiving a signal, wherein the means for filtering the signal comprises a high-pass filter having a corner frequency higher than the fundamental frequency of the alternating current power system and lower than three times the fundamental frequency of the alternating current power system;
   c. means for amplifying the filtered signal forming an amplified signal; and
   d. means for converting the amplified signal to a frequency-domain signal having harmonic signals, said means coupled to the means for filtering the signal.

2. The apparatus according to claim 1 wherein the means for filtering the signal is incorporated in a band-pass filter.

3. The apparatus according to claim 1 wherein the means for converting the filtered signal comprises a single-chip microprocessor having a regularly-sampled analog-to-digital converter.

4. The apparatus according to claim 3 wherein the single-chip microprocessor comprises means for executing a Discrete Fourier Transform.

5. The apparatus as claimed in claim 3 wherein the analog-to-digital converter samples the signal at a sampling frequency which is two orders of magnitude higher than the fundamental frequency of the power system.

6. An apparatus for measuring alternating current power line current waveform harmonics from an alternating current power system having at least two line conductors and a fundamental frequency, the apparatus comprising:
  a. means for receiving a signal proportional to an alternating current power line current waveform, said means coupled to the line conductors;
  b. means for filtering the signal forming a filtered signal, said means coupled to the means for receiving a signal, wherein the means for filtering the signal comprises a high-pass filter having a corner frequency higher than the fundamental frequency of the alternating current power system and lower than three times the fundamental frequency of the alternating current power system;
  c. means for amplifying the filtered signal forming a amplified signal; and
  d. means for converting the amplified signal to a frequency-domain signal having harmonic signals, said means coupled to the means for filtering the signal.

7. The apparatus according to claim 6 wherein the means for filtering the signal is incorporated in a band-pass filter.

8. The apparatus according to claim 6 wherein the means for converting the filtered signal comprises a single-chip microprocessor having a regularly-sampled analog-to-digital converter.

9. The apparatus according to claim 8 wherein the single-chip microprocessor comprises means for executing a Discrete Fourier Transform.

10. The apparatus as claimed in claim 8 wherein the analog-to-digital converter samples the signal at a sampling frequency which is two orders of magnitude higher than the fundamental frequency of the power system.

11. An apparatus for measuring alternating current power line voltage and current waveform harmonics from an alternating current power system having at least two line conductors and a fundamental frequency, the apparatus comprising:
  a. means for receiving a first signal proportional to an alternating current power line voltage waveform, said means coupled to the line conductor and the neutral conductor;
  b. means for filtering the first signal forming a first filtered signal, said means coupled to the means for receiving a first signal, wherein the means for filtering the signal comprises a high-pass filter having a corner frequency higher than the fundamental frequency of the alternating current power system and lower than three times the fundamental frequency of the alternating current power system;
  c. means for amplifying the first filtered signal forming a first amplified signal;
  d. means for converting the first amplified signal to a first frequency-domain signal having harmonic signals, said means coupled to the means for filtering the first signal;
  e. means for receiving a second signal proportional to an alternating current power line current waveform, said means coupled to the line conductor and the neutral conductor;
  f. means for filtering the second signal forming a second filtered signal, said means coupled to the means for receiving a second signal, wherein the means for filtering the signal comprises a high-pass filter having a corner frequency higher than the fundamental frequency of the alternating current power system and lower than three times the fundamental frequency of the alternating current power system;
  g. means for amplifying the second filtered signal forming a second amplified signal; and
  h. means for converting the second amplified signal to a second frequency-domain signal having harmonic signals, said means coupled to the means for filtering the second signal.

12. The apparatus according to claim 11 wherein the means for filtering the first signal and the means for filtering the second signal are both incorporated in band-pass filters.

13. The apparatus according to claim 11 wherein the means for converting the first amplified signal and the means for converting the second amplified signal comprises a single-chip microprocessor having a regularly-sampled analog-to-digital converter.

14. The apparatus according to claim 13 wherein the single-chip microprocessor executes a Discrete Fourier Transform.

15. The apparatus according to claim 13 wherein the analog-to-digital converter samples the first and second voltage signals at a sampling frequency which is two orders of magnitude higher than the fundamental frequency of the power system.

16. A method of measuring alternating current power line parameter waveform harmonics from an alternating current power system having at least two line conductors and a fundamental frequency, comprising the steps of:
  a. forming a signal proportional to an alternating current power line parameter waveform;
  b. filtering the signal through a high-pass filter forming a high-pass signal wherein the high-pass filter has a corner frequency higher than the fundamental frequency of the alternating current power system and lower than three times the fundamental frequency of the alternating current power system;
  c. amplifying the high-pass signal forming an amplified high-pass signal;
  d. converting the amplified high-pass signal to a frequency-domain high-pass signal having harmonic signals; and
  e. measuring the harmonic signals in the frequency-domain high-pass signals.

17. The method as claimed in claim 16 further comprising the step of converting the amplified high-pass signal and measuring the harmonic signals further comprises the step of regularly-sampling by an analog-to-digital converter.

18. The method according to claim 17 further comprising the step of resolving a Discrete Fourier Transform.

19. The method as claimed in claim 16 further comprising the step of communicating the frequency-domain high-pass signal to another system.

20. An instrument coupled to an alternating current power line system having a line conductor, a neutral conductor and a fundamental frequency, for measuring power line voltage or current waveform harmonics, the instrument comprising:
  a. a voltage attenuator coupled to the line conductor and the neutral conductor for receiving a first voltage signal proportional to the voltage difference between the line conductor and neutral conductor and reducing the first voltage signal to a level appropriate for further processing;

b. a first differential amplifier coupled to the voltage attenuator for removing any undesired common-mode signals;

c. a first low-pass filter, having an input and an output, the input coupled to the first differential amplifier for removing frequency components from the first voltage signal that are above one half of a sampling frequency;

d. a first high-pass filter, having an input and an output, the input coupled to the output of the first low-pass filter for removing a fundamental from the first voltage signal;

e. a first amplifier, having an input and an output, the input coupled to the output of the first high-pass filter for increasing the amplitude of remaining harmonic signals in the first voltage signal;

f. a current transformer coupled to the line conductor for sensing the current flowing through the line conductor;

g. a burden resistor coupled to the current transformer for forming a second voltage signal proportional to the current flowing through the line conductor;

h. a second differential amplifier coupled to the burden resistor for removing undesired common-mode signals;

i. a second low-pass filter, having an input and an output, the input coupled to the second differential amplifier for removing frequency components from the second voltage signal that are above one half of a sampling frequency;

j. a second high-pass filter, having an input and an output, the input coupled to the output of the second low-pass filter for removing a fundamental from the second voltage signal;

k. a second amplifier, having an input and an output, the input coupled to the output of the second high-pass filter for increasing the amplitude of remaining harmonic signals in the first voltage signal; and a single-chip microprocessor, having a read-only memory, a random-access memory, an analog-to-digital converter and a plurality of input/output circuits, the analog-to-digital converter coupled to the output of the first low-pass filter, the output of the first amplifier, the output of the second low-pass filter and the output of the second amplifier for converting the first and second voltage signals to a first and second frequency-domain representation, wherein the first and second high-pass filters have a corner frequency that is above the fundamental frequency of the power system and below a lowest harmonic frequency of interest.

21. The instrument as claimed in claim 20 further comprising a communications port coupled to one of the input/output circuits of the single-chip microprocessor for communicating with other systems.

22. The instrument as claimed in claim 20 wherein the analog-to-digital converter samples the first and second voltage signals at a sampling frequency which is two orders of magnitude higher than the fundamental frequency of the power system.

23. The instrument as claimed in claim 20 wherein the first amplifier has a higher gain than the second amplifier.

24. The instrument as claimed in claim 20 wherein a gain factor of the first and second amplifiers is set by the single-chip microprocessor for maximizing the resolution of harmonic measurements while avoiding saturation of the analog-to-digital converter.

* * * * *